United States Patent
Selz

(10) Patent No.: US 6,420,939 B1
(45) Date of Patent: Jul. 16, 2002

(54) OSCILLATOR HAVING A TUNABLE RESONANT CIRCUIT

(75) Inventor: Alfred Selz, Deisslingen (DE)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/718,857

(22) Filed: Nov. 22, 2000

(30) Foreign Application Priority Data

Nov. 24, 1999 (DE) .......................... 199 56 428

(51) Int. Cl.⁷ ............................ H03B 5/08; H03B 5/12; H03J 3/20

(52) U.S. Cl. ............... 331/179; 331/117 R; 331/177 V; 334/56; 334/58

(58) Field of Search ....................... 331/117 R, 117 FE, 331/117 D, 177 V, 177 R, 179; 333/175, 176; 334/56–58

(56) References Cited

U.S. PATENT DOCUMENTS 5,619,283 A   4/1997  Pugel ........................ 348/731
6,127,900 A * 10/2000  Laub et al. .................. 331/179

FOREIGN PATENT DOCUMENTS

| EP | 0911960 A1 | 4/1999 | ............ H03B/5/12 |
| EP | 0929153 A1 | 7/1999 | |
| WO | WO98/27643 | 6/1998 | ............ H03B/5/12 |

OTHER PUBLICATIONS

German Search Report citing the above–listed references: AA, AM and AN.

European Search Report citing the above–listed reference AL.

* cited by examiner

*Primary Examiner*—David Mis
(74) *Attorney, Agent, or Firm*—Joseph S. Tripoli; Kiniyuki Akiyama

(57) ABSTRACT

The oscillator having a tunable resonant circuit has a switch for expanding the tuning range, which is connected in series with two coils jointly determining the oscillation frequency of the resonant circuit. A further coil, which is coupled to the resonant circuit in the region of the switch, is used to supply a switching voltage for the switch. In this arrangement, the other end of this third coil is coupled to a reference potential, with a capacitor, which acts as a short circuit for radio-frequency purposes, decoupling the switching voltage from the reference potential. Since the switching voltage is in this case coupled to an oscillator circuit node which is earthed for radio-frequency purposes, it is of no significance in this case which resistor is used to couple the switching voltage. This means that the resonant circuit is not resistively damped by the connection of the switching voltage. Coupled to the other end of the switching diode is a further component, preferably a fourth coil, which has the same inductance as the third coil, in order to dissipate the switching voltage. The first two coils are advantageously of the same size, so that this circuit coil jointly determining the oscillation frequency is earthed by the third coil exactly at its center. This means that the quality factor and the oscillation properties of the resonant circuit are not adversely affected.

7 Claims, 1 Drawing Sheet

OSCILLATOR HAVING A TUNABLE RESONANT CIRCUIT

BACKGROUND

The present invention relates to an oscillator having a tunable resonant circuit which contains a tuning element, for example a variable capacitance diode, and a switch for expanding the tuning range. The switch permits one of the components which influence the oscillation frequency, usually a coil, to be bridged, with the result that this causes a changeover to another frequency band. Circuits of this type are used, in particular, in television sets to receive the lower and upper VHF bands.

A known circuit of this type is explained in more detail with the aid of FIG. 1: connected to an integrated circuit IC1 is a tunable LC resonant circuit having frequency-influencing components, coils L1 and L2 and capacitances C4 and C5. The integrated circuit IC1 is a commercially available tuner IC, for example of the type TUA 6014 XS from Siemens AG, which, besides the oscillator, also contains further circuits, such as a mixer and a PLL, and processes both the UHF band and the VHF band. In addition to various control voltages, the radio-frequency signal V (VHF) is also applied to this circuit.

The LC resonant circuit is arranged in the form of a parallel resonant circuit on the integrated circuit IC1, with the two coils L1 and L2 and the two capacitances C4 and C5 being connected in series in each case. One of the two capacitances, C4, is a variable capacitance diode, whose capacitance can be varied by a tuning voltage UT. In this arrangement, this voltage UT is applied to the variable capacitance diode C4 and to the resonant circuit via two relatively high-value resistors R3 and R4. Capacitors Ci1–Ci4 are used to couple the resonant circuit to the integrated circuit IC1.

A switch SD, usually a PIN diode, can be used to bridge one of the two coils, in this case the coil L2, which permits the oscillation frequency to be shifted through a relatively large range. In this context, turning on the switch SD connects the coil L1 to the capacitor C4, so that the inductance of the coil L2 is of no significance for the oscillation frequency in this case. To turn on the switch SD, a switching voltage US is required, which is applied to the LC resonant circuit via a resistor RS1 and is dissipated to earth G downstream of the switch SD via a resistor RS2. The capacitors C2 and C3, which act as a short circuit for radio-frequency purposes, decouple the tuning voltage UT and the switching voltage US, and the capacitor C1 filters the switching voltage US.

To change the switch SD to a low-resistance state, an appropriate current of a plurality of milliamperes needs to flow, depending on the type of switching diode SD. The result of this is that, depending on the available switching voltage US, e.g. 0 V and 5 V, the resistors RS1 and RS2 are in the region of one kilohm or less. Consequently, in the "upper VHF band" switching state, in which the switching diode SD is on, the oscillator is asymmetrically loaded by the parallel circuit comprising the resistors RS1 and RS2. In the "lower VHF band" switching state, when the switch SD is off, the coil L2 is resistively damped by the series circuit comprising the resistors RS1 and RS2 which is now present. The result is an impaired circuit quality factor, and hence impairment of the oscillation properties, which may result in oscillation suppression. Furthermore, the phase noise properties are impaired on account of the impaired circuit quality factor. Oscillators having good phase noise properties are required particularly for digital transmission methods, however.

The relatively low-value resistors RS1 and RS2 cannot be chosen to have higher resistance values, because the current through the switch SD becomes too small otherwise. These resistors could be replaced with inductors whose inductance value is much higher than the circuit coil inductance, but these are many times more expensive than the resistors and have natural resonance points which can likewise have an adverse effect on the oscillation properties of the oscillator.

The object of the invention is therefore to specify an economical oscillator having a tuning range which can be changed over using resistors and having good oscillation reliability and good phase noise properties.

SUMMARY OF THE INVENTION

The oscillator having a tunable resonant circuit in accordance with the invention has a switch for expanding the tuning range, which is connected in series with two coils jointly determining the oscillation frequency of the resonant circuit. A further coil, which is coupled to the resonant circuit in the region of the switch, is used to supply a switching voltage for the switch. In this arrangement, the other end of this third coil is coupled to a reference potential, for example earth, with a capacitor, which acts as a short circuit for radio-frequency purposes, decoupling the switching voltage from the reference potential.

Coupled to the other end of the switching diode is a further component, preferably a fourth coil, which has the same inductance as the third coil, in order to dissipate the switching voltage. The operation of the oscillator circuit in this case is as follows: if the switch is on, the third coil and the further components, connected to the switch SD in the context of the switching voltage, are of no significance for the oscillation frequency. If the switch is off, the third coil, just like the fourth coil, acts as a frequency-influencing element for the resonant circuit. Since the switching voltage is in this case coupled to an oscillator circuit node which is earthed for radio-frequency purposes, it is of no significance in this case which resistor is used to couple the switching voltage. This means that the resonant circuit is not resistively damped by the connection of the switching voltage.

The first two coils are advantageously of the same size, so that this circuit coil jointly determining the oscillation frequency is earthed by the third coil exactly at its centre. This means that the quality factor and the oscillation properties of the resonant circuit are not adversely affected.

This arrangement of the switch permits the resonant circuit to be of strictly symmetrical design when the fourth coil is used, because the third coil is coupled to the reference potential or to earth via the capacitor for radio-frequency purposes. Since the third and fourth coils can be in the form of air-core coils, the circuit may be of very economical design. No expensive inductors are used for changeover purposes.

BRIEF DESCRIPTION OF THE DRAWINGS

The invention is explained in more detail below by way of example using a circuit diagram shown in a further drawing. In the drawings.

DETAILED DESCRIPTION OF THE PREFERRED EMBODIMENT

Figure 1:
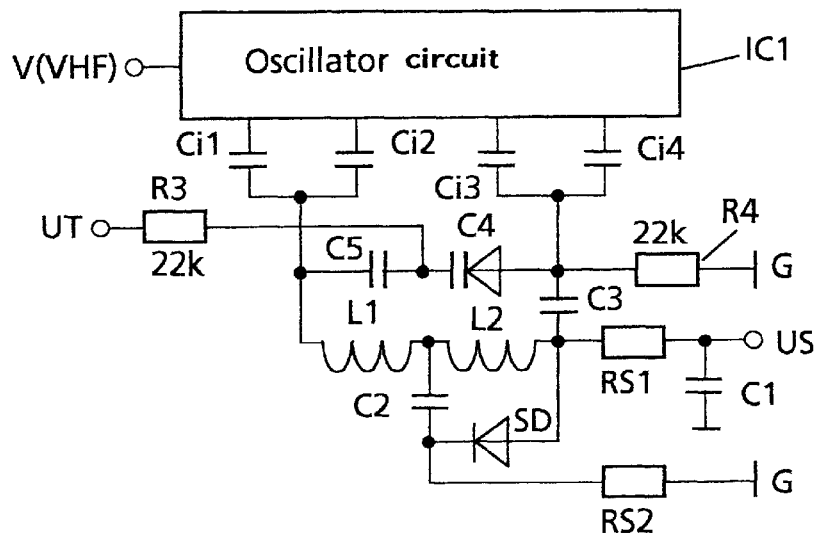
FIG. 1 shows an oscillator based on the prior art, as already described above.
Figure 2:
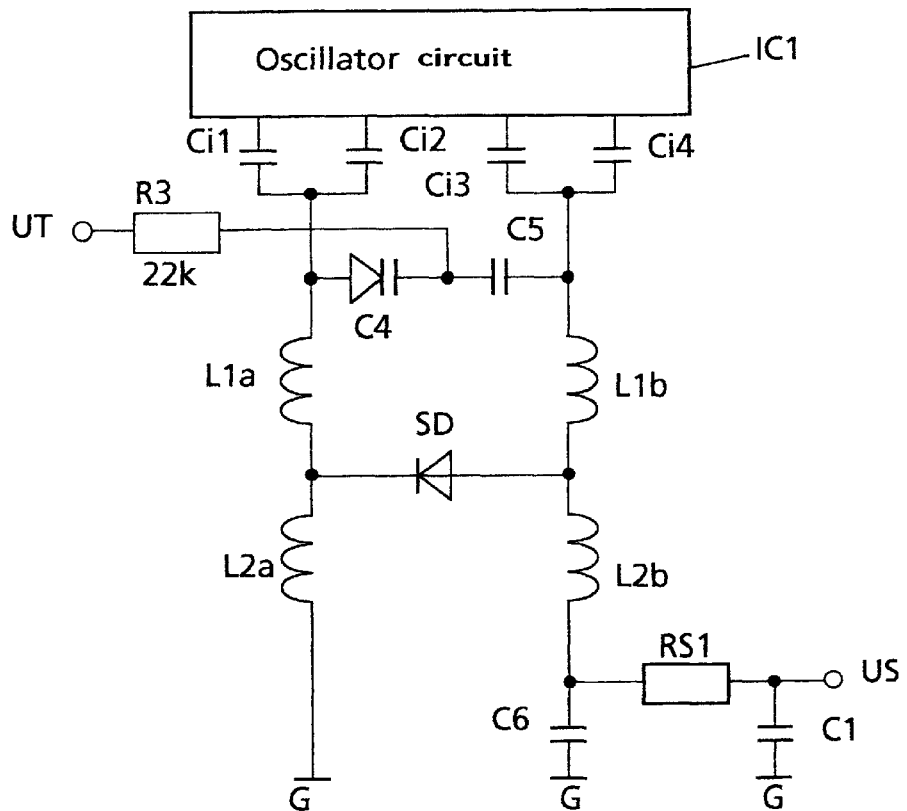
FIG. 2 shows an oscillator having a tunable resonant circuit in accordance with the invention.

Like the circuit in FIG. 1, the resonant circuit in FIG. 2 is likewise connected to an integrated circuit IC1, for example the tuner IC mentioned in the introduction, via capacitors Ci1–Ci4. This resonant circuit likewise contains two capacitances C4 and C5 which jointly determine the resonant frequency, the capacitance of the tuning element C4, for example a variable capacitance diode, being variable for the purpose of tuning the oscillation frequency. Connected in series with these capacitances C4 and C5 are two coils L1a and L1b in parallel which, by contrast with the circuit in FIG. 1, are connected to one another via a switch SD, however. In this arrangement, the switching voltage US is supplied for the switch SD via a third coil L2b. This coil L2b is connected to a reference potential G, in this illustrative embodiment to earth, via a capacitor C6 and acts as a frequency-influencing element when the switch SD is off. The value of the capacitor C6 in this case is such that the third coil L2b is earthed for radio-frequency purposes, with the result that the switching voltage US can be coupled to the coil L2b via a low-value resistor RS1. In this context, the capacitor C1 filters the switching voltage US. The switch SD is, in particular, a PIN diode or similar component. The tuning voltage UT for the tuning element C4 is likewise supplied via the resistor R3, as in FIG. 1, but in this case is dissipated to earth G via the coil L2a. Identical components in the circuits of FIGS. 1 and 2 are each denoted by the same reference symbols.

Connected to the other end of the switch SD is a fourth coil L2a, which is used to dissipate the switching voltage US to earth G when the switch SD is turned on. If the switch SD is off, the resonant circuit oscillates using the coils L1a, L1b and the coils L2a, earth and L2b, so that it is possible to change over to the lower VHF band in this illustrative embodiment. In this case, the inductances of the two coils L2a and L2b are of the same size, in particular, so that the fact that the switch SD is off does not adversely affect the quality and oscillation properties of the oscillator, since the centre of the circuit coil can be earthed in an unearthed resonant circuit, as is the case here. Since both coils L2a and L2b are connected to a reference potential or to earth G for radio-frequency purposes, this wiring means that the resonant circuit does not see connection of the switching voltage US both when the switch SD is on and when the switch SD is off. This permits the resistor RS1 to be chosen to have any desired low value in order to set a desired current for the switching diode SD. The wiring of the resonant circuit can be chosen, in particular, to be strictly symmetrical, since the capacitor C6 earths the coil L2b for radio-frequency purposes, with the result that the circuit has good electrical properties. In one preferred illustrative embodiment, the inductances of the four coils have the following relationships: La1=L1b and L2a=L2b.

What is claimed is:

1. Oscillator comprising a tunable resonant circuit and a switch for expanding the tuning range, characterized in that two coils are connected in series with a tuning element, the two coils being capable of being connected to one another via the switch, and in that a further coil is connected in series with one of these coils in the region of the switch, the other end of said further coil being coupled to a reference potential, that a switching voltage for the switch is coupled between the further coil and the reference potential and that the further coil is connected to the reference potential via a capacitor in order to block the switching voltage from the reference potential.

2. Oscillator according to claim 1, characterized in that a further component, particularly a fourth coil, is arranged symmetrically with respect to the further coil between the resonant circuit and the reference potential.

3. Oscillator according to claim 1, characterized in that the inductances of the first two coils are essentially the same size.

4. Oscillator according to claim 3, characterized in that the oscillator having the components which influence the oscillation frequency is of strictly symmetrical design.

5. Oscillator according to claim 1, characterized in that the switching voltage is coupled to the further coil via a low-value resistor.

6. Oscillator according to claim 1, characterized in that the switch is a PIN diode, the tuning element is a tunable capacitor or a variable capacitance diode, and in that the reference potential is earth.

7. Oscillator having a tunable resonant circuit and a switch for expanding the tuning range, characterized in that two coils connected in series with a tuning element can be connected to one another via the switch, and in that the switching voltage for the switch is supplied via a further coil, which, when the switch is off, is a component which jointly determines the oscillation frequency of the resonant circuit, in the region of the switch, and is dissipated downstream of the switch via a further component.

* * * * *